(12) United States Patent
Jang et al.

(10) Patent No.: US 7,126,411 B2
(45) Date of Patent: Oct. 24, 2006

(54) HIGH VOLTAGE GENERATOR

(75) Inventors: Ji Eun Jang, Kyoungki-do (KR); Jae Jin Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 144 days.

(21) Appl. No.: 10/999,593

(22) Filed: Nov. 30, 2004

(65) Prior Publication Data
US 2006/0001477 A1    Jan. 5, 2006

(30) Foreign Application Priority Data
Jul. 1, 2004    (KR) .................. 10-2004-0051056

(51) Int. Cl.
*G05F 1/10* (2006.01)
(52) U.S. Cl. ...................... 327/536; 327/74
(58) Field of Classification Search ............ 327/72, 327/73, 74, 77, 88, 89, 143, 407, 408, 534, 327/536
See application file for complete search history.

(56) References Cited

U.S. PATENT DOCUMENTS
5,703,415 A * 12/1997 Tanaka ...................... 307/66
6,466,079 B1 * 10/2002 Kushnarenko ............ 327/536
7,046,074 B1 * 5/2006 Jang ........................ 327/534

FOREIGN PATENT DOCUMENTS
KR    20010048996    6/2001

* cited by examiner

*Primary Examiner*—Jeffrey Zweizig
(74) *Attorney, Agent, or Firm*—Ladas & Parry LLP

(57) ABSTRACT

Disclosed is a high voltage generator comprising: a first voltage level detector for detecting a voltage level of the high voltage; a second voltage level detector for detecting difference between the high voltage and a power supply voltage; a high voltage pump for performing a pumping operation to generate a high voltage when one of output signals of the first voltage level detector and the second voltage level detector is enabled; and a controller for receiving the output signal of the second voltage level detector, and for connecting a terminal through which the high voltage is output with the power supply voltage when the high voltage is lower than the power supply voltage.

6 Claims, 3 Drawing Sheets

HIGH VOLTAGE GENERATOR

BACKGROUND OF THE INVENTION

1. Field of the Invention

The present invention relates to a high voltage generator, and more particularly to a high voltage generator for a semiconductor device which detects a falling of a high voltage level of the device below a voltage level of a power source and then enables the fallen high voltage level to recover to the voltage level of a power source.

2. Description of the Prior Art

FIG. 1A is a block diagram illustrating a conventional high voltage generator.

As shown in FIG. 1A, the high voltage generator includes a high voltage level detector 101, a high voltage pump 102 and an NMOS transistor 10.

The high voltage level detector 101 compares a high voltage VPP with a reference voltage VREFC and judges whether or not the high voltage VPP has a higher level than that of the reference voltage VREFC. When the high voltage VPP has a lower level than that of the reference voltage VREFC, the high voltage level detector 101 outputs an output signal PPE of a high level, thereby enabling the high voltage pump 102.

As generally known in the art, the high voltage pump 102 includes a ring oscillator and a pumping circuit. A detailed circuit of the high voltage pump 102 is well known to those skilled in the art, so detailed description thereof will be omitted.

An output terminal of the high voltage pump 102 is connected to the source of the transistor 10, and both of the drain and the gate of the transistor 10 are connected to the power supply voltage VDD.

FIG. 1B is a circuit illustrating a conventional high voltage detector 101.

In FIG. 1B, a voltage level of a reference voltage VREFC is decided as follow:

$$\{R2/(R1+R2)\}*VPP\text{-target}=VREFC$$

Herein, the 'VPP–target' represents the target value of the high voltage desired by a user.

Therefore, when the voltage level of the high voltage has a lower value than the target value of the high voltage, the output signal PPE of the high voltage level detector becomes a high level, thereby operating the high voltage pump.

FIG. 2 is a graph for exampling relation among the power supply voltage VDD, the high voltage VPP and the reference voltage VREFC shown in FIGS. 1A and 1B.

In FIG. 2, region '(1)' represents a state just after the power supply voltage is applied, region '(2)' represents a normal operation region in which the power supply voltage VDD exceeds a predetermined level, and region '(3)' represents a region in which the power supply voltage is very high, in which region '(3)' is typically employed when a burn-in test is performed.

As shown in regions '(1)' and '(3)' in FIG. 2, there are sections in which the high voltage VPP output from the conventional high voltage generator is lower than the power supply voltage VDD due to the transistor 10 shown in FIG. 1A. That is, there is no problem when the high voltage VPP is higher than the power supply voltage VDD. However, when the high voltage VPP is lower than the power supply voltage VDD, the voltage of the source (i.e., an output terminal of the high voltage pump) of the transistor becomes 'VDD-Vth' (herein, 'Vth' is a threshold voltage) due to the effects of the transistor 10 having the diode property, thereby causing a problem.

In this case, that is, when the high voltage VPP is lower than the power supply voltage VDD, a latch-up phenomenon happens in a PMOS transistor which is located in a memory cell array region of a memory device using the high voltage VPP as a bulk voltage.

SUMMARY OF THE INVENTION

Accordingly, the present invention has been made to solve the above-mentioned problems occurring in the prior art, and an object of the present invention is to provide a high voltage generator capable of preventing an output voltage thereof from being lower than a power supply voltage.

In order to accomplish this object, the present invention provides a circuit for detecting voltage level difference between the high voltage and the power supply voltage and using the power supply voltage as the high voltage instantly when the high voltage becomes lower than the power supply voltage.

In accordance with another aspect of the present invention, there is provided a high voltage generator for generating a high voltage used for a semiconductor device, the high voltage generator comprising: a first voltage level detector for detecting a voltage level of the high voltage; a second voltage level detector for detecting difference between the high voltage and a power supply voltage; a high voltage pump for performing a pumping operation to generate a high voltage when one of output signals of the first voltage level detector and the second voltage level detector is enabled; and a controller for receiving the output signal of the second voltage level detector, and for connecting a terminal through which the high voltage is output with the power supply voltage when the high voltage is lower than the power supply voltage.

In accordance with still another aspect of the present invention, the first voltage level detector includes a comparator circuit which operates the high voltage pump when a voltage level of the high voltage becomes lower than a target value of the high voltage.

In accordance with still another aspect of the present invention, the second voltage level detector includes a comparator circuit which outputs an enable signal for operating the high voltage pump and the controller when a voltage level of the high voltage becomes lower than that of the power supply voltage.

In accordance with still another aspect of the present invention, the controller includes an inverter unit for receiving the output signal of the second voltage level detector and a switch for performing a turn-on/off operation according to an output signal of the inverter unit, in which the switch performs a switching operation between a terminal for the power supply voltage and a terminal for the high voltage.

In accordance with still another aspect of the present invention, the high voltage generator further comprises an NMOS transistor, in which a drain and a gate of the NMOS transistor receive the power supply voltage, and a source of the NMOS transistor is connected to an output terminal of the high voltage pump for outputting the high voltage.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
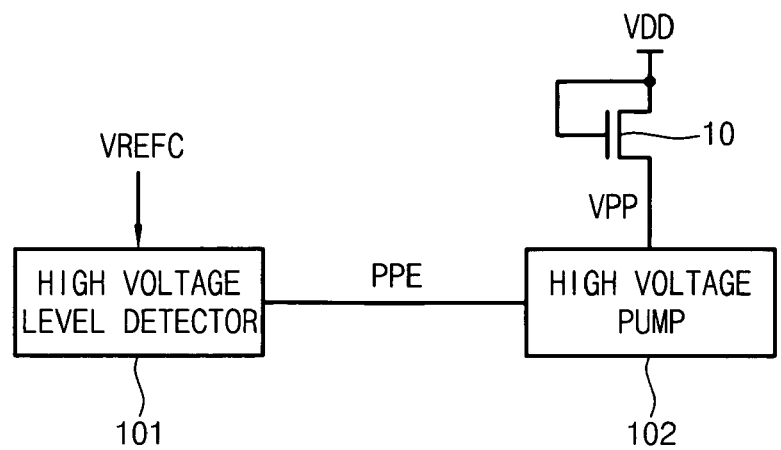
FIG. 1A is a block diagram illustrating a conventional high voltage generator.
Figure 1B:
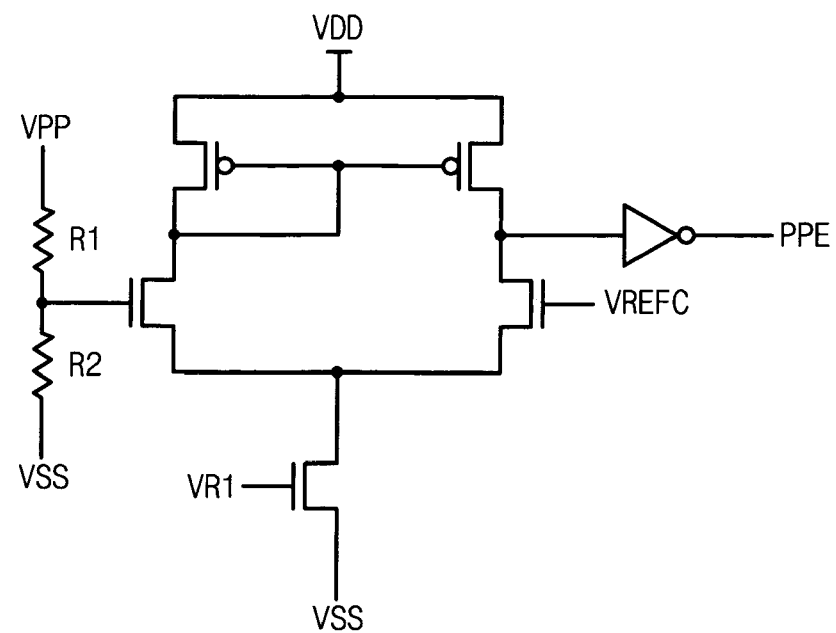
FIG. 1B is a circuit diagram illustrating a conventional high voltage detector.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3:
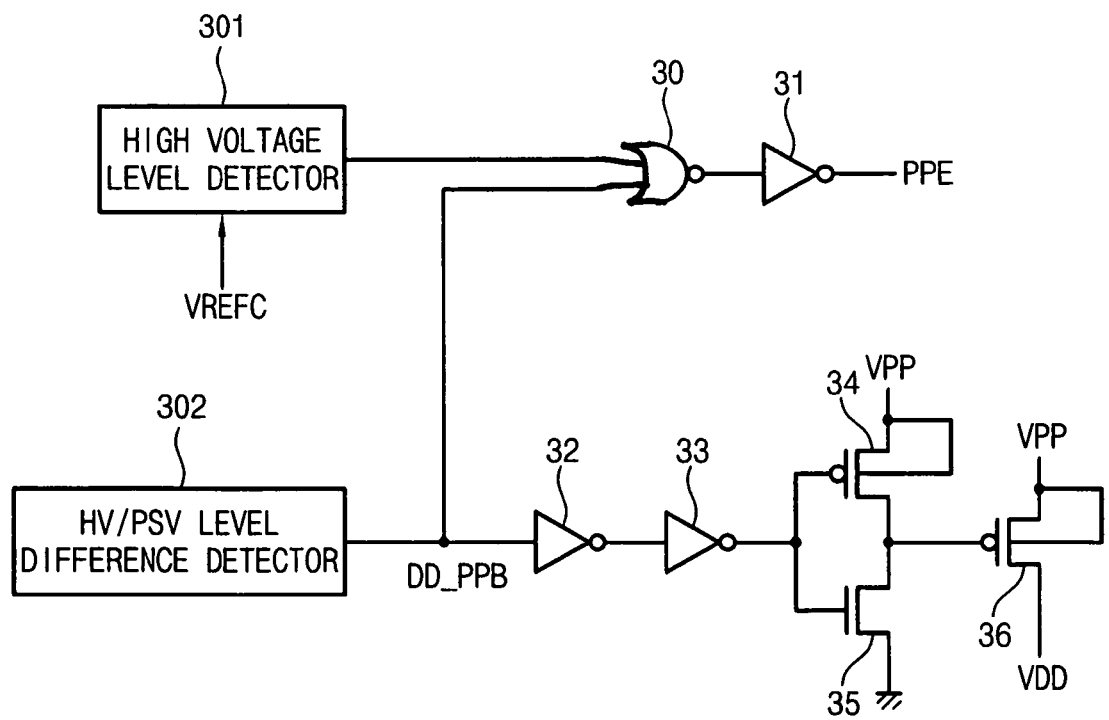
FIG. 3 is a block diagram for explaining the operation of a high voltage generator according to an embodiment of the present invention.

FIG. 3 is a block diagram for explaining the operation of a high voltage generator according to an embodiment of the present invention.

Figure 2:
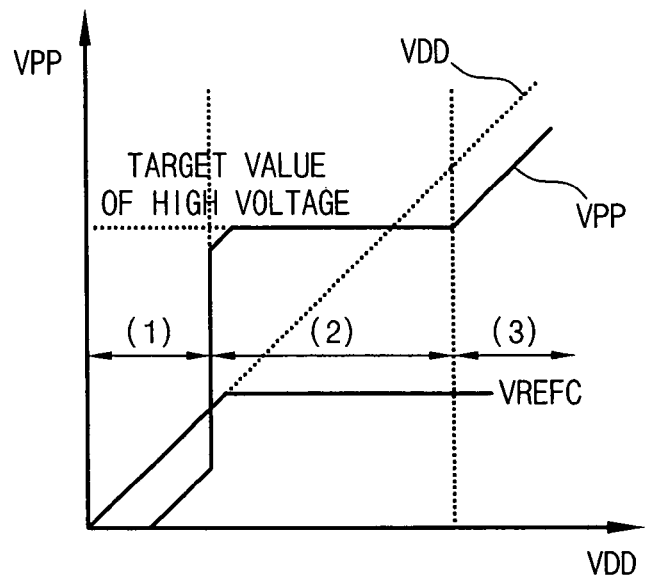
FIG. 2 is a graph for explaining relation among the power supply voltage, the high voltage and the reference voltage shown in FIGS. 1A and 1B.

In FIG. 3, a high voltage level detector 301 includes a comparator for detecting a voltage level of a high voltage used in a semiconductor device. A detailed circuit of the high voltage level detector 301 includes the same construction as that shown in FIG. 2. That is, when the high voltage is lower than the target value of the high voltage, the high voltage level detector 301 outputs an output signal at a high level.

Figure 5:
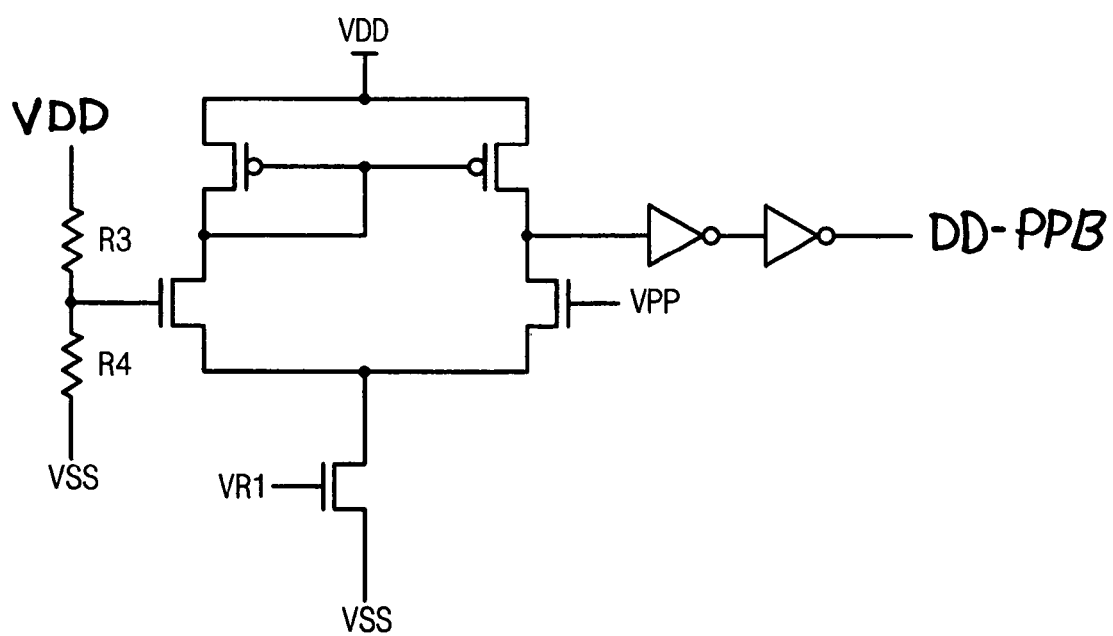
FIG. 5 is a circuit diagram illustrating a high voltage-power supply voltage level difference detector shown in FIG. 3.

A high voltage-power supply voltage level difference detector (hereinafter, referred to as HV-PSV level difference detector) 302 includes a comparator for detecting a voltage difference between a high voltage VPP and a power supply voltage VDD. An example of the HV-PSV level difference detector 302 is shown in FIG. 5.

An output signal of the high voltage level detector 301 and an output signal 'DD_PPB' of the HV-PSV level difference detector 302 are applied to input terminals of a NOR gate 30, and an output signal of the NOR gate 30 is applied to the input terminal of an inverter 31. As described with reference to FIG. 1A, an output signal of the inverter 31 is applied to a high voltage pump. For reference, the high voltage pump and an NMOS transistor connected to the high voltage pump shown in FIG. 1A are omitted in FIG. 3 in order to avoid repetition of the same description of the circuit.

The output signal 'DD_PPB' of the HV-PSV level difference detector 302 is applied to an inverter means 32, 33, and 34 and 35 includes an odd number of inverters which are connected to each other in a series.

An output signal of the inverter 34 and 35 is applied to the gate of a PMOS transistor 36. The drain of the PMOS transistor is connected to the power supply voltage VDD and the source thereof is connected to a terminal of the high voltage. Herein, the terminal of the high voltage represents an output terminal of the high voltage pump.

As described above, FIG. 5 is a circuit illustrating the HV-PSV level difference detector 302.

In FIG. 5, a voltage compared with the high voltage VPP is $\{R3/(R3+R4)\}VDD$. Herein, for an embodiment of the present invention, preferably, it is required that 'R3' has a much smaller value of that of 'R4'. That is, it is preferred to satisfy a condition of '$\{R3/(R3+R4)\}*VPP=VDD-Va$ (Herein, 'Va' has a very small value)'. In FIG. 5, 'VR1' represents a control signal for operation of the circuit.

In operation, when the voltage level of the high voltage VPP becomes lower than that of a comparison voltage 'VDD-Va', the output signal 'DD_PPB' of the comparator changes into a high level.

Therefore, as described with reference to FIG. 3, the PMOS transistor 36 is turned on by the inverter means 32 to 35, so that the voltage level of the high voltage becomes the same value as the voltage level of the power supply voltage.

Figure 4:
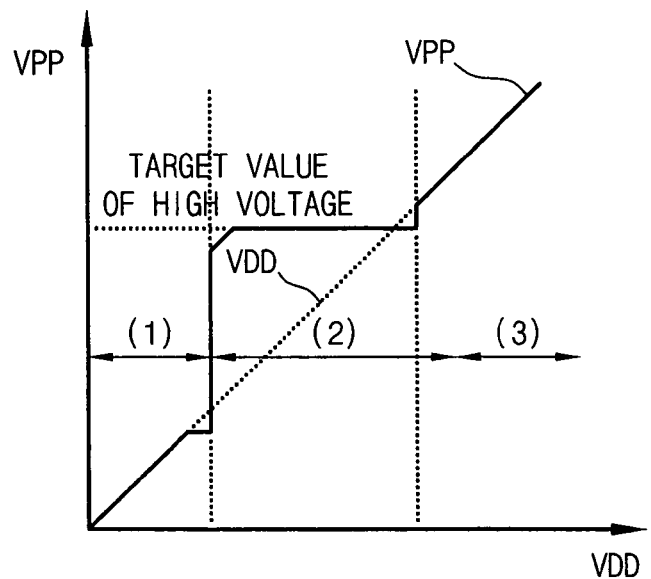
FIG. 4 is a graph for explaining the operation of the high voltage generator shown in FIG. 3.

FIG. 4 is a graph for explaining the operation of the high voltage generator shown in FIG. 3.

Referring to FIG. 4, it should be understood that the high voltage VPP has the same value as the power supply voltage VDD in regions '(1)' and '(2)'. This is because, when the high voltage becomes lower than the power supply voltage, the HV-PSV level difference detector 302 operates to turn on the PMOS transistor 36 (see FIG. 3), thereby connecting the output terminal of the high voltage pump to the power supply voltage.

As described above, the high voltage generator according to the present invention can prevent the high voltage from falling by connecting the terminal of the high voltage to the power supply voltage when the high voltage becomes lower than the power supply voltage. Therefore, the high voltage generator according to the present invention can prevent the occurrence of a "latch-up" phenomenon which may occur in a PMOS transistor which uses a bulk voltage as a high voltage.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A high voltage generator for generating a high voltage used for a semiconductor device, the high voltage generator comprising:

a first voltage level detector for detecting a voltage level of the high voltage;

a second voltage level detector for detecting difference between the high voltage and a power supply voltage;

a high voltage pump for performing a pumping operation to generate the high voltage when one of output signals of the first voltage level detector and the second voltage level detector is enabled; and a controller for receiving the output signal of the second voltage level detector, and for connecting a terminal through which the high voltage is output with the power supply voltage when the high voltage is lower than the power supply voltage.

2. The high voltage generator as claimed in claim 1, wherein the first voltage level detector includes a comparator circuit which operates the high voltage pump when a voltage level of the high voltage becomes lower than a target value of the high voltage.

3. The high voltage generator as claimed in claim 1, wherein the second voltage level detector includes a comparator circuit which outputs an enable signal for operating the high voltage pump and the controller when a voltage level of the high voltage becomes lower than that of the power supply voltage.

4. The high voltage generator as claimed in claim 1, wherein the controller includes an inverter unit for receiving the output signal of the second voltage level detector and a switch for performing a turn-on/off operation according to an output signal of the inverter unit, in which the switch performs a switching operation between a terminal for the power supply voltage and a terminal for the high voltage.

5. The high voltage generator as claimed in claim 4, wherein the switch includes a PMOS transistor and the output signal of the inverter unit is applied to a gate of the PMOS transistor.

6. The high voltage generator as claimed in claim 1, further comprising an NMOS transistor, in which a drain and a gate of the NMOS transistor receive the power supply voltage, and a source of the NMOS transistor is connected to an output terminal of the high voltage pump for outputting the high voltage.

\* \* \* \* \*